United States Patent
Groos (10) Patent No.: US 7,451,414 B2
(45) Date of Patent: Nov. 11, 2008

(54) METHOD FOR DETERMINING RELEVANT CIRCUIT PARTS IN A CIRCUIT IN THE EVENT OF LOADING WITH A TEMPORALLY VARIABLE SIGNAL

(75) Inventor: Gerhard Groos, Munich (DE)

(73) Assignee: Infineon Technologies AG, Munich (DE)

( * ) Notice: Subject to any disclaimer, the term of this patent is extended or adjusted under 35 U.S.C. 154(b) by 347 days.

(21) Appl. No.: 11/158,910

(22) Filed: Jun. 21, 2005

(65) Prior Publication Data

US 2006/0236275 A1 Oct. 19, 2006

(30) Foreign Application Priority Data

Jun. 21, 2004 (DE) ................. 10 2004 029 944

(51) Int. Cl.
*G06F 17/50* (2006.01)
(52) U.S. Cl. ................................. 716/5; 716/1
(58) Field of Classification Search ............ 716/4–6, 716/1
See application file for complete search history.

(56) References Cited

U.S. PATENT DOCUMENTS

| | | | |
|---|---|---|---|
| 6,493,850 B2 * | 12/2002 | Venugopal et al. ............. 716/4 |
| 6,553,542 B2 | 4/2003 | Ramaswamy et al. | |
| 6,591,233 B1 | 7/2003 | Sonoda | |
| 7,024,646 B2 * | 4/2006 | Logie et al. .................... 716/5 |
| 7,243,317 B2 * | 7/2007 | Wang et al. .................... 716/4 |
| 7,302,378 B2 * | 11/2007 | Hayashi ......................... 703/14 |

OTHER PUBLICATIONS

Baird et al., "VerifyESD: A Tool for Efficient Circuit Level ESD Simulations of Mixed-Signal ICs", EOS/ESD Symposium Proceedings, IEEE, Sep. 2000, pp. 465-469, (5 pages).
Gossner, "ESD Protection for the Deep Sub Micron Regime—A Challenge for Design Methodology", Proceedings of the 17$^{th}$ International Conference on VLSI Design, Jan. 2004, pp. 809-818, (10 pages).

* cited by examiner

*Primary Examiner*—Thuan Do
*Assistant Examiner*—Binh C Tat
(74) *Attorney, Agent, or Firm*—Maginot, Moore & Beck (57) ABSTRACT

Method for determining relevant circuit parts in a circuit in the event of loading with a temporally variable signal comprises providing a computer-implemented model of the circuit, in which the circuit components are represented at least partly by equivalent DC signal models, the parameters of which take account of at least one parameter of the temporally variable signal, carrying out a DC signal analysis for the circuit on the basis of the model provided, and taking account of a DC signal which is present at at least two connections for coupling in the temporally variable signal and is dependent on at least one of the parameters of the temporally variable signal.

16 Claims, 5 Drawing Sheets

METHOD FOR DETERMINING RELEVANT CIRCUIT PARTS IN A CIRCUIT IN THE EVENT OF LOADING WITH A TEMPORALLY VARIABLE SIGNAL

FIELD OF THE INVENTION

The invention relates to a method for determining relevant circuit parts in a circuit in the event of loading with a temporally variable signal, the circuit having a number of circuit components which are connected up to one another and are connected up in each case by means of connections between at least two circuit nodes. Loading with a temporally variable signal is to be understood hereinafter to mean in particular pulsed voltage or current loading such as may result for example from an electrostatic discharge (ESD).

BACKGROUND

Electronic circuits, in particular integrated circuits (ICs), are simulated prior to their realization, before the actual fabrication of the masks—required for fabricating integrated circuits—for the individual semiconductor processes. This procedure helps to save costs since malfunctions of the circuit can still be determined prior to realization in order to change the circuit. If the circuit is not examined sufficiently during the design, possible faults may not be identified until after the realization of the circuit or the IC by means of complicated experimental tests, which necessitates subsequent changes in the circuit design, and thus to the circuit layout, and the fabrication of new circuit patterns.

Owing to the complexity of present-day integrated circuits, which comprise up to a few million components, circuit simulation is effected by using computer programs which, in automated fashion, determine voltages and currents in the circuit branches of a circuit depending on input signals present at connections of the circuit. One computer program that is customary for circuit simulation is the circuit simulation program SPICE (EECS Department of the University of California in Berkeley: Homepage: http://www.eecs.berkeley.edu/ .SPICE Homepage: http://bwrc.eecs.berkeley.edu/Classes/ IcBook/SPICE).

For the simulation using such a program, a so-called netlist is created, which contains information about all the circuit nodes occurring in the circuit to be simulated and the circuit components connected to the respective nodes. In order to simulate the circuit behavior, i.e. in order to calculate the currents and voltages in the circuit, use is made of models of the circuit components to be realized, which are usually stored in a model library that is accessed by the simulation program. The models describe the real behavior of the individual circuit components for example on the basis of the transfer response of the individual circuit components. SPICE models for discrete and integrated components which occur in a circuit to be simulated are usually made available by the manufacturers of said components or the developers of the IC technology used, for example on Internet pages.

The simulation comprises simulating not only normal operating states but also, inter alia, "exceptional states", such as may occur for example in the event of electrostatic discharges (ESDs) at the connections of the circuit. Said ESDs may occur either without external interconnection, for example as a result of an ungrounded person touching the circuit, or else during operation. In order to determine the robustness of the circuit toward such current pulses occurring as a result of ESD and in order to determine possibly jeopardized circuit components in the circuit, it is necessary, in principle, to simulate the entire circuit including protection structures present, if appropriate, at the connections, in order to be able to change jeopardized circuit regions if appropriate while still at the design stage.

For examining the circuit behavior in the event of ESD interference pulses being applied to the circuit inputs, a so-called transient simulation is required, which determines the temporal profiles of the currents and voltages occurring in the circuit depending on the temporal profile of the interference pulse. For this purpose, the circuit has to be completely simulated for a multiplicity of different input values, which in each case represent temporally successive samples of the interference pulse, in which case, for determining the currents and voltages for each of these input values, it is additionally necessary to take account of the circuit state for the previous input value and the time difference with respect to this previous circuit stage. As the number of components present in the circuit increases and as the temporal resolution increases, this procedure rapidly encounters its limits owing to the requisite high computational capacity.

In order to be able to carry out such simulations with a tenable outlay, developers nowadays "manually" extract presumed jeopardized circuit structures in order to obtain a circuit structure which is reduced with regard to the number of components and for which such a transient simulation can be carried out with tenable computational complexity. However, this manual procedure in the extraction of circuit structures is very prone to error because current paths that may critically influence the circuit behavior in the event of interference pulses can easily be overlooked in complex circuits having a multiplicity of components. Added to this is the fact that precisely parasitic effects may critically influence the circuit behavior in the event of such interference pulses. Although said parasitic effects can be taken into account in the models of the circuit components used for the simulations, they are usually not directly evident from a circuit diagram, which only shows the individual "useful" circuit components of the circuit and which is usually used by developers for manual circuit extraction.

One possibility for automating the search for jeopardized circuit components or circuit sections is described in Baird, M.; Ida, R.: "VerifyESD: A Tool for Efficient Circuit Level ESD Simulations of Mixed-Signal ICs", EOS/ESD Symposium Proceedings (2000), pages 465-469. The method explained is based on a circuit having two connections between which an ESD pulse is present. The method comprises assigning to all the components present in the circuit in each case a critical voltage that specifies a voltage loading limit for, the respective component, where damage or destruction of the component or at least a current flow through the component must be expected in the event of said limit being exceeded. Resistances and capacitances are replaced by short circuits in this case. The circuit is then examined in automated fashion for all current paths between the two connections and each current path is allocated a critical voltage corresponding to the sum of the critical voltages of all the components present in the current path. If this critical voltage of a path is less than a voltage—which can be predetermined by the user—corresponding for example to the maximum voltage resulting from an ESD pulse, then the respective current path is marked as critical. All current paths marked as critical are then taken over into a reduced circuit on the basis of which exact transient simulations can be carried out.

In this known method, each pair of connections of a component has a fixed critical voltage; therefore, the switching state of a transistor, for instance, or the voltage established at a voltage divider cannot be taken into account. If, by way of example, an output of an inverter realized by two transistors is loaded by an interference pulse, then it is usually the case that one of the two transistors is switched off and one is switched on, to be precise depending on a potential established in transient fashion (e.g. by means of capacitive or resistive voltage dividers) at the input. The voltage that is certainly still harmless thus results e.g. as a sum of the threshold voltage, that is to say the voltage at which the transistor switches on, and the breakdown voltage thereof. When determining the critical voltages, the known algorithm can only assume either turned-off or turned-on transistors, that is to say in the above case must regard either threshold or breakdown voltage as the critical voltage, and thus in any case obtains an incorrect result—with either unnecessarily many or incorrectly too few critical current paths.

SUMMARY

It is an aim of the present invention to provide an automated method for reliably determining relevant circuit parts in a circuit, which method can be carried out by means of conventional simulation tools and can be realized with tenable computational complexity, and to provide a method for determining involved circuit parts on the basis of circuit parts determined as relevant, in particular for determining critical paths in a circuit.

This object is achieved according to the invention by methods for determining relevant and involved circuit parts in a circuit in the event of loading with a temporally variable signal.

The invention relates to a method for determining relevant circuit parts in a circuit in the event of loading with a temporally variable signal, the circuit having a number of circuit components which are connected up to one another and are in each case connected up by means of connections between at least two circuit nodes, at least one relevance criterion in each case being assigned to at least some of the circuit parts, and the circuit having at least one first and one second connection for coupling in the temporally variable signal, the method comprising the following method steps of:
  providing a computer-implemented model of the circuit, in which the circuit components are represented at least partly by equivalent DC signal models, the parameters of which take account of at least one of the following parameters of the temporally variable signal: gradient of a rising edge, duration of a pulsed signal component, gradient of a falling edge,
  carrying out a DC signal analysis for the circuit on the basis of the model provided, taking account of a DC signal which is present at the at least two connections and is dependent on at least one of the following parameters of the temporally variable signal: amplitude, gradient of a rising edge, duration of a pulsed signal component, gradient of a falling edge, and determining those circuit parts as relevant in the case of which at least one relevance criterion is satisfied on account of the DC signal present at the circuit.

Circuit parts, in connection with the present invention, are in particular circuit components, connections of the circuit components and circuit nodes. The temporally variable signal may be a voltage or current signal; the signal used for the DC signal analysis may correspondingly be a DC voltage signal or a DC current signal.

The invention is based on the insight that for the circuit states of a circuit in the event of temporally variable loading of the circuit, passive components such as capacitances, inductances, resistances and diodes, including parasitic passive components such as parasitic capacitances, interconnect resistances, component breakdowns, etc., also play a critical part, and these passive components may in turn critically influence, for example switch on or off, the states of active circuit parts such as transistors. In this case, the term "circuit states" is to be understood to mean the totality of the physical quantities known in the circuit, that is to say in particular currents and voltages.

The invention is furthermore based on the insight that the reaction behavior of such passive components for instance to temporally variable signals with known signal parameters, such as amplitude, gradient of rising and falling edges and duration of a pulsed signal component, can be described by the behavior of equivalent components with application of a DC signal. In this case, in particular, a current that flows maximally through said passive components on account of the variable signal and the voltage dropped across the component can be described by equivalent components. Models of such components which exhibit the same reaction upon application of a DC signal as a real component upon application of a temporally variable signal are referred to hereinafter as "equivalent DC signal models".

A capacitance can be approximated for example by a resistance whose resistance value is dependent on the capacitance value and on the slope of the signal pulse. An inductance can correspondingly be approximated by a resistance whose resistance value is dependent on the inductance value and the duration of the signal pulse. Equivalent DC voltage models of resistances are resistances. Using the equivalent DC voltage models for capacitances, inductances and resistances, equivalent DC voltage models of further components, such as transistors or diodes, for example, can easily be derived from already existing models describing the component behavior by replacing capacitances, inductances and resistances by the corresponding DC voltage models.

In contrast to known methods, in the case of the invention, capacitances and resistances are not replaced by short circuits, but rather by equivalent DC signal models, and a DC signal analysis is carried out based on said DC signal models in order to determine those circuit parts which satisfy at least one relevance criterion.

The relevance criterion may be satisfied particularly if a current that flows through the circuit part or a voltage that is present across the circuit part reaches a predetermined threshold.

In this case, the relevance criterion may be chosen such that it indicates the risk of damage to the circuit part, that is to say that in the event of the relevance criterion being satisfied, there is the risk of damage to the circuit part.

Furthermore, the relevance criterion may also indicate an arbitrary further operating state of the circuit part. Thus, by way of example, there is the possibility of choosing relevance criteria for transistors such that they indicate a switched-on state. This switch-on state may recognized for example on the basis of a current or a voltage in the control circuit, i.e. the electric gate-source circuit in the case of MOSFETs or the electric base-emitter circuit in the case of bipolar transistors, and the relevance criterion may be defined correspondingly depending on said current or said voltage.

One embodiment of the method provides for at least two relevance criteria to be defined for the circuit, which are assigned to different relevance categories, in which the circuit parts which satisfy the respective relevance criterion are determined for each relevance category.

In this case, one of the relevance categories may relate to a possible jeopardization of the circuit parts, i.e. this relevance category contains the relevance criteria for the individual circuit parts which indicate a jeopardization of the individual circuit parts. The circuit parts which are determined as relevant in the context of this relevance category are then to be classified as jeopardized. Another relevance category may relate to the presence of specific operating states.

The equivalent DC signal model of a circuit component is preferably designed in such a way that it takes account of the at least one relevance criterion assigned to the circuit component, and that it supplies at one of its connections a current flow lying above a predetermined threshold if the at least one relevance criterion is satisfied. In this way, those circuit parts which bring about this current flow can then advantageously be identified in accordance with the method for determining involved circuit parts described below. For this purpose, the DC signal model may comprise for example one zener diode or two zener diodes reverse-connected in series with predetermined breakdown voltages, dependent on the relevance criterion, in parallel with the resistance.

The circuit states of a circuit at the end of a signal pulse present at the connecting terminals thereof can thus be determined by a DC signal simulation using equivalent DC voltage models, only a single simulation having to be carried out per signal pulse, which considerably reduces the computational complexity compared with methods in which a transient simulation is carried out.

The DC voltage models required for the simulation can be derived, as already explained, from conventional component models, in which case capacitances and inductances, in particular, are to be replaced by their equivalent resistances. If appropriate, a plurality of or correspondingly parameterized or scalable equivalent DC voltage models may be made available for a circuit component, which in each case describe the reaction of the circuit components to signal pulses with different parameters. These equivalent DC voltage models for individual components only have to be generated once and can be stored like conventional component models for circuit simulations in libraries that can be accessed by the simulation tool. As a result, conventional simulation tools, in particular the SPICE simulation program that is executable on a standard computer, can be used for the simulation.

The simulation determines, for each circuit branch in the circuit in which a circuit component is arranged, the current flowing through the respective branch and the voltage present across the respective branch. In this case, the current can be compared with a maximum permissible current of the circuit component in order to determine jeopardized circuit components by means of this comparison. In this case, the maximum permissible current forms the examined relevance criterion. Overvoltages can also be determined by comparison with a maximum permissible voltage.

The invention is furthermore based on the insight that, in the case of a circuit in which relevant circuit parts are present, not only the relevant circuit parts have to be examined in greater detail in order to be able to evaluate the overall behavior of the circuit, but also those circuit parts which, together with the circuit parts determined as relevant, form an electric circuit between supply connections of the circuit and which critically influence a current flow through the relevant circuit components. These circuit components are referred to hereinafter as involved circuit parts.

When determining such involved circuit parts, it is necessary to avoid having to search through the entire circuit. This is crucial for the efficiency of the method, since the overall circuit may comprise millions of components, whereas in the event of a specific loading possibly fewer than a hundred components are involved in the current flow or critically influence it.

The method according to the invention for determining involved circuit parts in a circuit having a number of circuit components which are connected up to one another and are connected up in each case by means of connections between at least two circuit nodes, and having at least one circuit part determined as relevant, has the following steps of:

a) identifying the at least one circuit part determined as relevant as an involved circuit part, b) examining a circuit part that has hitherto not been identified as involved and identifying the examined circuit part as involved depending on at least one of the following parameters: circuit states of the circuit parts already identified as involved, circuit state of the examined circuit part, type of connection between the circuit part identified as involved and the circuit part currently being examined, circuit state of said connection, c) repetition of method step b) until there is no longer a circuit part that is newly determined as involved.

In the case of this method, the relevant circuit parts are preferably determined using the method explained above, in which an equivalent DC signal model of the circuit is generated and a DC signal analysis is carried out.

A circuit part that has hitherto not been identified as involved may be identified as an involved circuit part for example depending on results determined on the basis of said DC signal analysis of the circuit. However, this may, of course, also be effected on the basis of results obtained e.g. using a different DC voltage analysis, a transient simulation or small-signal AC voltage analysis.

Preferably, in method step b), only those circuit parts are examined which are connected to circuit parts that have already been identified as involved directly or via a number of other circuit parts, said number not exceeding a predetermined number. The computational complexity in the search for involved circuit parts can thereby be considerably reduced.

In one embodiment, it is provided that, in method step b), the examined circuit part is determined as involved if a current whose magnitude is greater than a predetermined threshold value flows through it.

In a further embodiment, it is provided that, in method step b), from a plurality of examined circuit parts which are connected to an involved circuit part directly or indirectly, the circuit part through which the greatest current flows is identified as involved.

Moreover, there is the possibility, in method step b), from a plurality of examined circuit parts which are connected to an involved circuit part directly or indirectly, of identifying as involved the circuit parts through which flows in each case a current that is greater than a predetermined proportion of the total current flowing through the involved circuit part or of the current flowing maximally from an individual one of the plurality of circuit parts into the involved circuit part or out of the latter.

A further embodiment provides, in method step b), from a plurality of examined circuit parts which are connected to an involved circuit part directly or indirectly, for identifying as involved only the circuit parts through which together flows a current that is greater than a predetermined proportion of the current flowing through the involved circuit part. It is supplementarily proposed to make the selection among these plurality of circuit parts unambiguously by those circuit parts which carry a respectively higher current being identified with prime priority as involved. In this way, the circuit parts that are not identified as involved also individually carry a smaller current than the ones selected in this step.

Instead of a current proportion, new involved circuit parts may also be selected on the basis of a multiple or some other function of the corresponding current. This may become necessary with circuit parts that are indirectly connected to one another. In this case, the value of the predetermined proportion or the type of function may be chosen in particular in a manner dependent on the type of examined circuit part.

The selection criteria explained above for further involved circuit parts ensure that only those circuit parts which supply the critical part of a current through a circuit part that has already been determined as involved beforehand are newly added to the group of involved circuit parts.

In addition to the current through a circuit part, the voltage across a circuit part may, of course, also serve as a selection criterion for inclusion in the group of involved circuit parts. Thus, in one embodiment, it is provided that, in method step b), the examined circuit part is determined as involved if a voltage present across the circuit part exceeds a predetermined value. In this case, too, the threshold value may be chosen depending on the type of circuit part.

In order to limit the size of the partial circuit determined as involved, that is to say of the partial circuit which comprises the circuit parts determined as involved, and also for the definition of the boundary conditions at the (not followed further) nodes or connections of said partial circuit, it may be expedient to know the magnitude of the minimum distance between the circuit parts determined and the circuit parts initially involved as relevant. In this case, as a measure of the distance between two circuit parts, use may be made of the number of circuit parts which lie on the paths between them.

Therefore, a further embodiment provides for identifying differently the circuit parts determined as involved depending on how many circuit parts are situated at least on the paths to the circuit parts determined as relevant. By way of example, the initially relevant circuit parts may receive the identification "0", those connected directly thereto the identification "1", etc. A circuit part newly determined as involved would then receive an identification increased by 1 compared with the circuit parts already determined.

As an alternative, the identification may be realized by searching for new involved circuit parts iteratively, proceeding from all the initially known involved circuit parts, and continuing to search only in the next iteration step proceeding from these newly found involved circuit parts. The number of these iteration steps is then the required measure of the distance to the next relevant circuit part; it is thus present globally in each case and need not be assigned directly to the circuit parts.

A further embodiment provides for identifying differently the circuit parts determined as involved depending on the criterion on the basis of which they were determined as involved. By way of example, it is thus possible to distinguish between the direct current paths through the relevant circuit parts and further, indirectly involved paths.

In this case, there is the possibility of making the criteria for the selection of the examined circuit part as involved dependent on the type of identification of an involved circuit part that is connected to the examined circuit part directly or indirectly. In particular, it is advantageous to intensify the selection criteria for involved components with increasing distance to the relevant components, in such a way that the number of components that are newly recognized as involved decreases as the distance increases.

Preferably, the following further method steps are carried out for the partial circuit with the circuit parts determined as involved, in order to obtain a more exact assessment of the circuit behavior:

d) providing a computer-implemented model of the circuit parts determined as involved, e) carrying out a transient loading analysis.

After relevant—e.g. jeopardized—circuit parts have been determined, according to the present invention all circuit parts are thus additionally extracted which are critical for the current flow or the voltage distribution in said relevant circuit parts or critically influence them, in order to produce a reduced circuit for which a transient simulation can be carried out. Said transient simulation serves for more precisely examining the behavior of the circuit components determined as relevant in the event of a signal pulse being applied to connections of the circuit, since the DC voltage simulation can only yield a first estimation with regard to the behavior of individual circuit components. For said transient simulation, the equivalent DC voltage models of the individual circuit components on the reduced circuit are again replaced by component models which are suitable for the simulation of the transient large-signal behavior of the individual components. These are models which already exist nowadays in model libraries for circuit simulation and/or which are made available by component manufacturers.

All the methods presented can advantageously be automated by being performed under computer control, e.g. within a CAD design environment.

The present invention is explained in more detail below with reference to figures.

BRIEF DESCRIPTION OF THE DRAWINGS

FIG. 3 shows the idealized temporal profile of an input voltage pulse (FIG. 3a) and temporal profiles of the current through a capacitor, an inductance and a resistance upon application of this pulse across the respective component (FIGS. 3b, 3c, 3d).

DETAILED DESCRIPTION

In the figures, unless specified otherwise, identical reference symbols designate identical parts with the same meaning.

Figure 1:
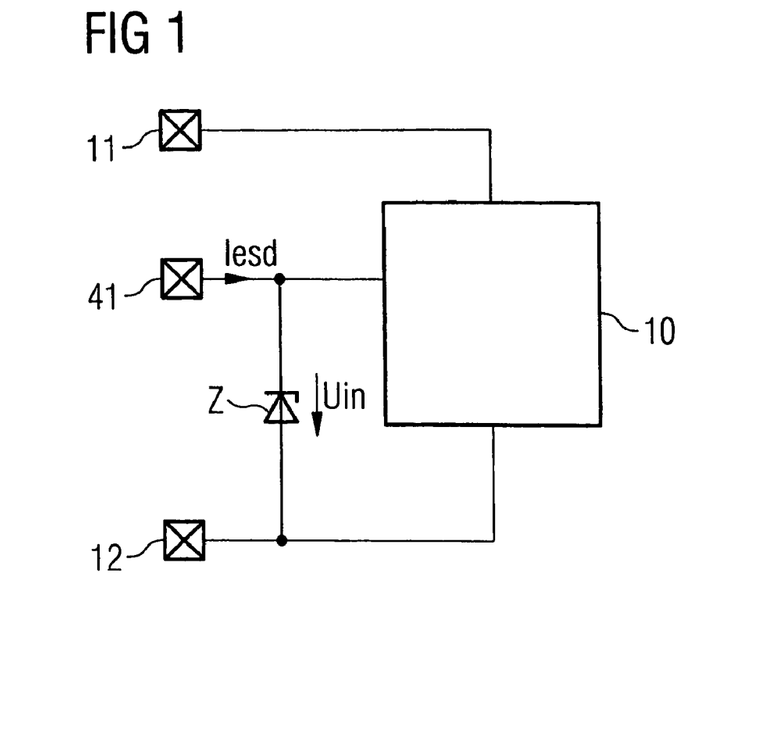
FIG. 1 schematically shows a circuit with a plurality of connecting terminals and a protection circuit.
Figure 2:
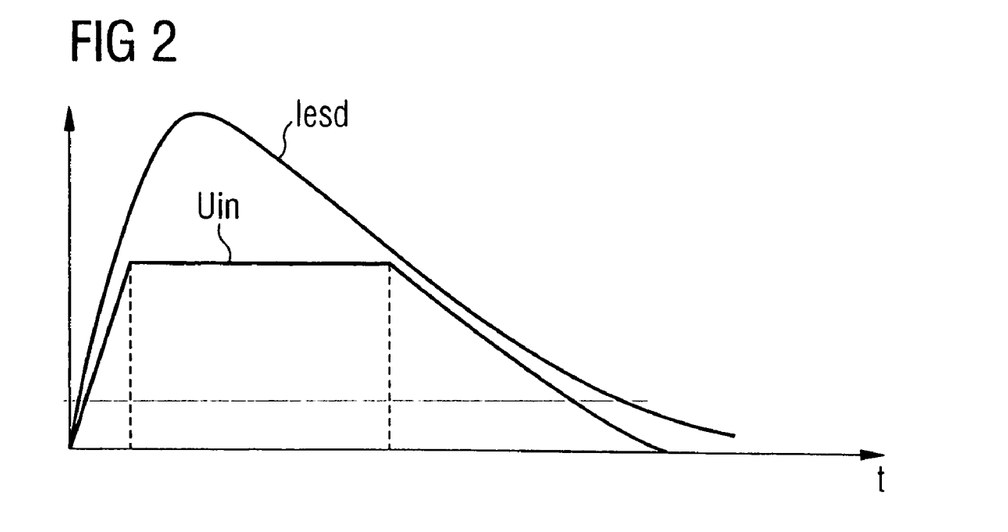
FIG. 2 shows, in idealized fashion, the temporal profile of an ESD pulse and a resultant input voltage of the circuit according to FIG. 1.

FIG. 1 schematically shows an electronic circuit with three connecting terminals 11, 12, 41, the connecting terminals 11, 12 of which, by way of example, serve for application of a supply voltage and the connecting terminal 41 of which serves as signal input or signal output. Electronic circuits, in particular large scale integrated electronic circuits, are jeopardized by current pulses from electrostatic discharge processes (ESD processes), that is to say jeopardized by a temporally variable current or voltage signal. A typical profile for a current pulse Iesd resulting from such an electrostatic discharge is illustrated in FIG. 2.

In order to protect the circuit against overvoltages resulting from such ESD pulses, protective measures are taken by means of external interconnection of the electronic circuit 10. As an example of such a protective measure, FIG. 1 shows a zener diode Z connected in the reverse direction between the signal input or signal output 41 and the terminal 12, which is for example at a reference potential for the entire circuit. The effect of this zener diode Z becomes clear from the temporal profile—illustrated in idealized fashion—of the input voltage Uin that results from the ESD pulse and is present at the input 41. Said voltage at said input 41 relative to reference potential initially rises depending on the properties of the zener diode Z and the interference pulse Iesd, and, upon reaching the breakdown voltage of the zener diode Z, is clamped to the value of said breakdown voltage until the voltage Uin resulting from the ESD pulse Iesd has again fallen below the value of the breakdown voltage of the zener diode Z.

In this case, what are critical for the circuit 10 are, in particular, the maximum value of said input voltage Uin, its steep rise and the time duration during which the voltage remains at an upper voltage value Ûin. Currents, in particular parasitic currents, which may result from the transient profile of the input voltage pulse in the circuit additionally have a destructive effect in this case. In particular, capacitances in the event of a rapid rise in the voltage pulse Uin may temporarily lead to currents in the circuit which, if appropriate, may bring about critical states or directly destructions in the circuit.

Figure 3A:
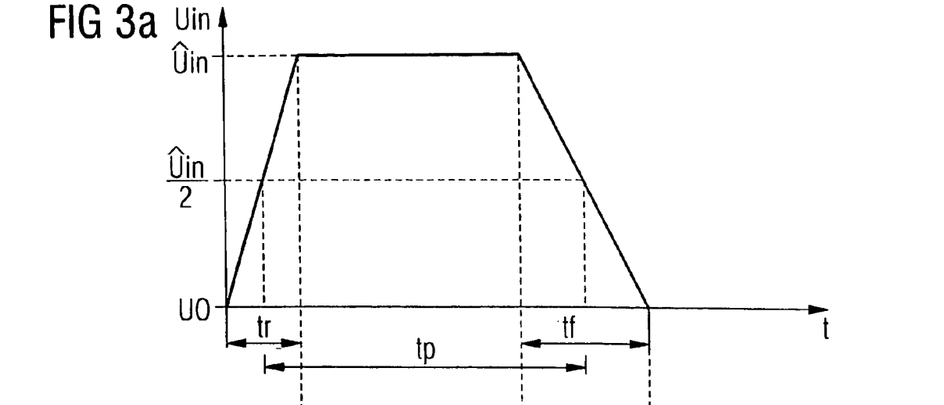

The loading of the electronic circuit 10 with the zener diode Z—present as overvoltage protection—by an ESD interference pulse can thus be described to an approximation by a voltage pulse—illustrated in FIG. 3a—with a rise duration tr, a longer fall duration tf in comparison with the rise duration, and a pulse duration tp measured at half the pulse height. This voltage pulse Uin rises within the rise duration tr with a constant slope from an initial value U0, for example zero, to a maximum value Ûin, remains at said maximum value Ûin for the duration tp—(tr+tf)/2, and then falls within the fall duration tf to the initial value U0 again.

Figure 3B:
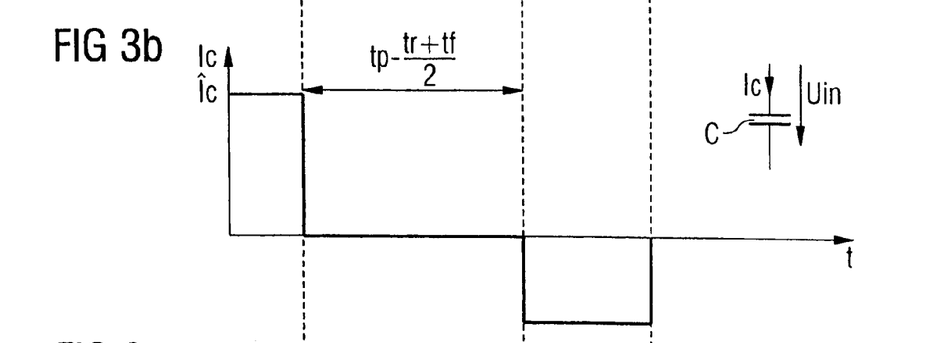

FIG. 3b shows the temporal profile of a current Ic through the capacitor C upon application of said voltage pulse Uin. This current is dependent on the temporal change in the voltage Uin during the rise duration tr in accordance with:

$$Ic = C \cdot dUin/dt \quad (1)$$

Given a constant rise in the voltage Uin during the rise duration tr to the maximum value Ûin, the following holds true for the capacitor current Ic:

$$Ic = \hat{i}c = C \cdot \hat{U}in/tr \quad (2)$$

or, solved for Ûin/Ic:

$$\hat{U}in/\hat{i}c = tr/C =: Rc \quad (3)$$

The relationship between maximum voltage Ûin and maximum current Îin can thus be described by an ohmic behavior with the aid of the resistance Rc defined in (3).

A capacitor current with an opposite sign to the current during the rise duration is correspondingly established during the fall duration Tf.

Figure 3C:
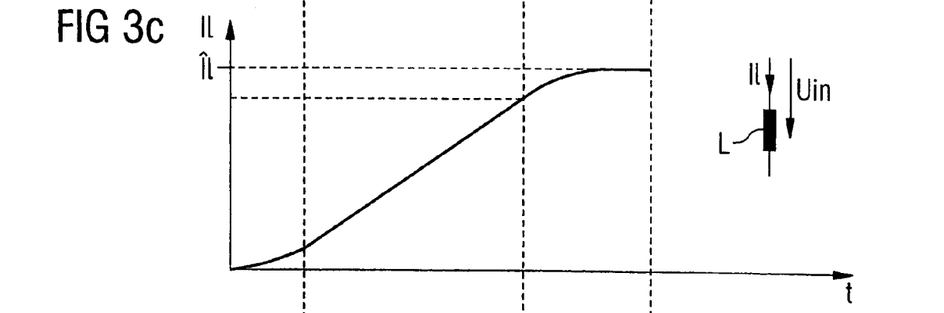

The temporal profile of a current Il through an inductance L upon application of the voltage pulse Uin across said inductance L is illustrated in FIG. 3c. As is known, the following holds true for the current Il through said inductance L:

$$dIl/dt = Uin/L \quad (4)$$

Integrating this equation taking account of the profile of the voltage Uin as illustrated in FIG. 3a yields for the maximum current îl at U0=0:

$$\hat{i}l = 1/L \cdot \hat{U}in \cdot tp \quad (5)$$

or, rearranged as above:

$$\hat{U}in/\hat{i}l = L/tp =: Rl \quad (6)$$

In a coil as well, therefore, the relationship between the maximum values of current and voltage can be represented here by an Ohm's law.

Figure 3D:
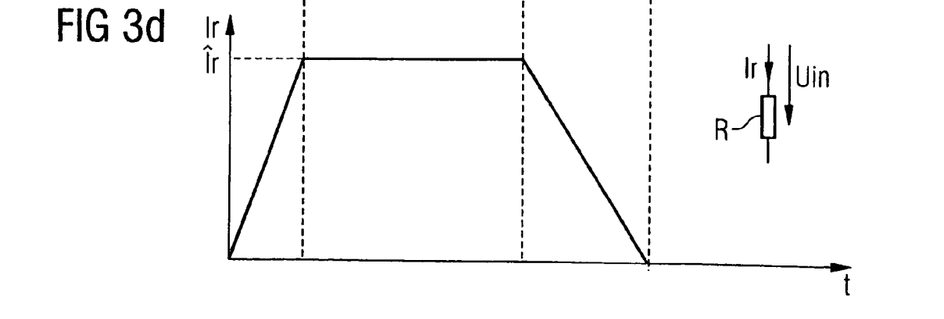

The temporal profile of a current Ir through a resistance R across which a voltage pulse Uin in accordance with FIG. 3a is present is illustrated in FIG. 3d. Said current Ir is proportional to the voltage Uin with the value of the resistance R as a proportionality factor.

The idea of the invention consists, then, in using, for a circuit simulation of the electrical circuit 10, DC signal models of the circuit components used, the current consumption of which, in the event of a DC voltage with a predetermined amplitude being applied to the circuit 10, corresponds at least approximately to the maximum current that would be established in the real components on which the models are based upon application of a transient loading in accordance with FIG. 3a at connecting terminals of the circuit 10. (As an alternative, it is possible to consider the current established after the pulse rise time.)

The ohmic equivalent models derived above serve for this purpose. They depend here only on tr or tp, but may also be configured e.g. to be voltage-dependent, for instance if a voltage-dependent capacitance is present. If it is assumed to an approximation that the rise duration with which the switching states are established in the circuit is similar to the rise time tr of the impressed signal, these models can be used for a DC signal simulation. If a DC voltage having the value Ûin is then impressed, the voltage and current values that would be established in the event of transient loading at the end of the pulse rise time tr are obtained under these preconditions in the circuit.

In significant cases, such as e.g. with capacitive or resistive voltage dividers, this approximation is exact. In general, deviations are obtained which can be taken into account in the subsequent transient simulation.

If it is not possible to preclude the situation in which, by way of example, due to rapidly switching transistors within the circuit, a shorter rise duration of the signal that forms there is effected—which in turn means higher transient currents in capacitances involved—it is possible to analyze the most critical case by means of an additional simulation of identical configuration in which the switching time of the fastest component that occurs is used as the pulse rise duration tr. In this way, there is no underestimation of the currents through capacitances in comparison with the transient simulation case.

A simulation using the model derived above thus constitutes a simulation of the worst-case conditions, the simulation in the worst case determining as jeopardized individual components which are not actually jeopardized, but no jeopardized components are overlooked in this case.

If, moreover, the capacitance value of the capacitance is voltage-dependent, so that the capacitance value C is a function of the voltage Uc present across the capacitance, then said capacitance can be simulated under worst-case conditions in that the following holds true for the value of the equivalent resistance:

$$Rc = tr/Cmax \quad (7)$$

where Cmax denotes the maximum value of the voltage-dependent capacitance. Moreover, the quotient of the rise time and the minimum capacitance value, the mean value of the capacitance value or an arbitrary function of the capacitance value may also be used for the modeling of the capacitance by the equivalent resistance. In particular, the resulting equivalent resistance may be voltage-dependent.

As explained, the current or the voltage across the equivalent resistance Rc of the DC signal model of the capacitor C represents capacitor current in the real circuit or a voltage across the capacitor C in the real circuit, in each case at the end of the pulse rise time.

In the circuit analysis, it is of interest, in particular, whether the voltage across a capacitor exceeds a predetermined voltage value. In this case, said voltage value may be chosen such that in the event of said voltage being exceeded, there is the risk of the capacitor being destroyed. If the capacitor represents, in a circuit, for example, the gate-source capacitance of a MOS transistor, for example, in it may be of interest, in particular, whether the voltage present across the capacitor exceeds a switch-on threshold of the transistor.

The voltage thresholds of interest in connection with the operation of a capacitor represent relevance criteria for the component, a relevance criterion being satisfied if the voltage threshold on which the relevance criterion is based is exceeded.

Figure 4A:
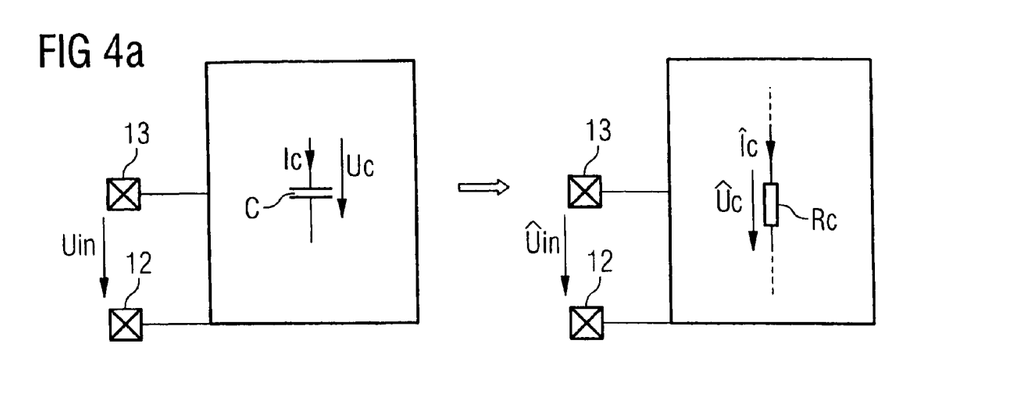
FIG. 4 illustrates equivalent DC voltage models for some components.
Figure 4B:
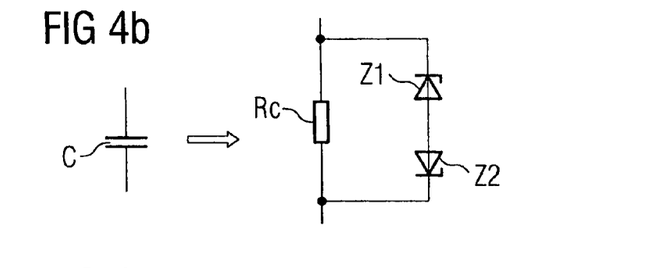

Such a relevance criterion can be taken into account in the model by setting a corresponding marker for the affected circuit part as soon as the voltage threshold is exceeded. As an alternative, two zener diodes Z1, Z2 reverse-connected in series may be connected with respect to the equivalent resistance Rc, which diodes, upon reaching a voltage threshold which is connected with the relevance criterion and is given by the break-down voltage of the zener diodes Z1, Z2, turn on in order to bring about a current flow through the equivalent resistance Rc. In this case, the relevance criterion for the component is deemed to be satisfied if a current flows through the zener diodes. This additionally ensures that a current path through the capacitor exists which can be extracted well by means of the method for determining involved circuit parts that is presented below. This equivalent DC voltage model of a capacitor C is illustrated in FIG. 4*b*.

In this case, there is also the possibility, in a manner that is not specifically illustrated, of assigning to a component a plurality of relevance criteria of which, referring to the above example, one relates for example to a jeopardization of the component and another relates to the presence of a specific circuit state, for example the switching on of a transistor connected with the component.

One of the relevance criteria, for example a possible destruction, is checked by a zener diode in this case. A further relevance criterion, for example a specific operating state that is defined by the reaching of a specific current through the circuit part or a specific voltage across the circuit part, may be determined by means of a suitable current or voltage measuring arrangement.

The equivalent DC voltage model of an inductance L may be represented by a resistance R1 in accordance with equation (6), as illustrated above. This model includes the pulse duration tp, in contrast to the equivalent DC voltage model of a transistor, which depends on the pulse rise time tr. Consequently, the method illustrated cannot deal with circuits in which, in the relevant paths, capacitances and inductances contribute similarly to the current flow. However, this is not the case with IC technologies, because they contain no or only very small (parasitic) inductances.

The equivalent DC voltage models of resistances are resistances, so that no separate equivalent DC voltage models have to be taken into account in the circuit to be simulated for resistances, rather the resistances are merely maintained.

The equivalent DC voltage models of further components, such as diodes or transistors, for example, can be derived from existing simulation models for these components by replacing parasitic inductances or capacitances of these components by the equivalent DC voltage models explained, or the equivalent resistances. This procedure is illustrated on the basis of a diode in FIG. 4*c*.

Figure 4C:
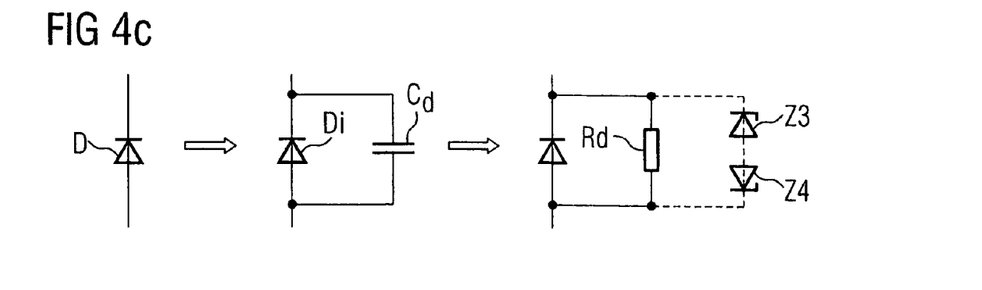

FIG. 4*c* shows a real diode D, the equivalent circuit diagram of this diode D, which comprises an ideal diode Di and a parasitic capacitance Cd, and also the equivalent DC voltage model of this diode. This equivalent DC voltage model of the diode comprises the ideal diode Di, which is distinguished by an ideal voltage-current profile, and also an equivalent resistance Rd connected in parallel with the ideal diode Di, said equivalent resistance representing the parasitic capacitance Cd. The zener diodes reverse-connected in series in the model are optionally present if the original model of the diode does not contain the breakdown in the reverse direction. In this case, the zener diode Z1 models the breakdown or indicates an overvoltage; zener diode Z2 is used to the effect that, in the forward direction, the current flows only through the ideal diode Di (and Rd), but not through Z1, which would corrupt the model behavior.

Figure 4D:
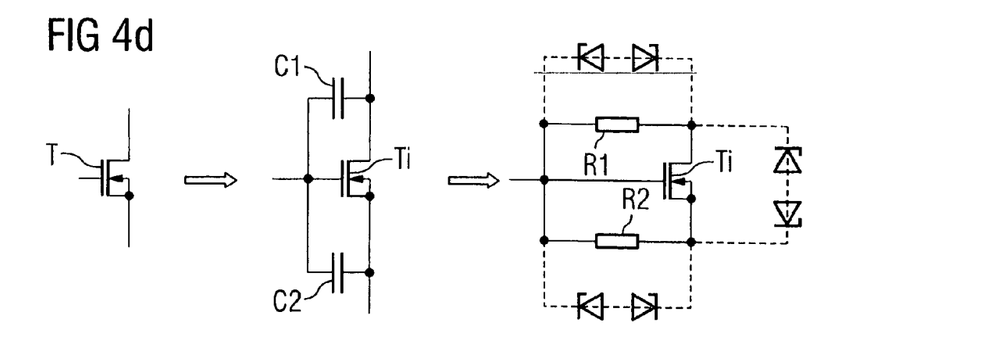

FIG. 4*d* shows a real transistor T, the equivalent circuit diagram of this transistor, which comprises an ideal transistor Ti and also two parasitic capacitances, namely the gate-drain capacitance C1 thereof and the gate-source capacitance C2 thereof, and also the equivalent DC voltage model of this transistor. This equivalent DC voltage model comprises the ideal transistor Ti and two equivalent resistances R1, R2 representing the parasitic capacitance C1, C2. The zener diodes, which are reverse-connected in series with one another and in each case connected in parallel with the resistors, in the model are optionally present. In order to be able to simulate a breakdown of the drain-source path of the component, as in the case of the equivalent DC voltage model of a diode, two zener diodes reverse-connected in series are connected in parallel with the drain-source path of the component, which are dimensioned such that their breakdown voltage corresponds to the breakdown voltage of the transistor.

Figure 5:
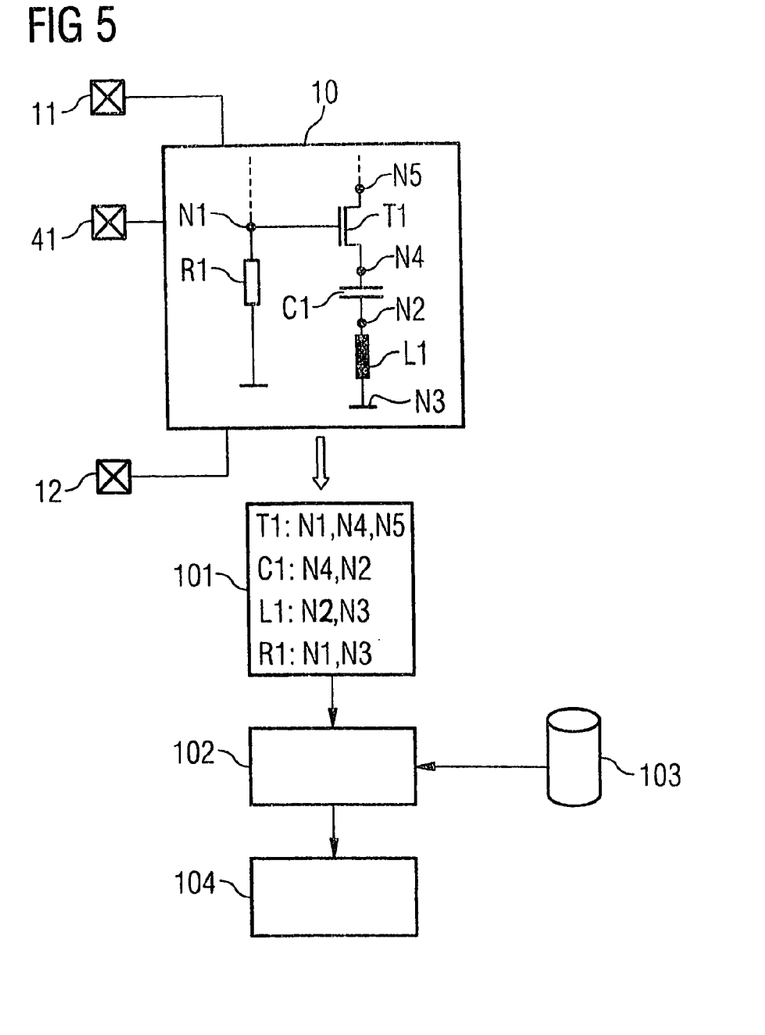
FIG. 5 illustrates the sequence of the method according to the invention for determining jeopardized components.

The basic procedure for determining circuit components which satisfy predetermined relevance criteria in a circuit 10 in the event of loading with a temporally variable signal, in particular a pulse signal, is explained below with reference to FIG. 5.

The circuit to be examined forms the starting point for the method. By way of example, FIG. 5 shows such a circuit with three connections 11, 12, 41 and with a number of components R1, T1, C1, L1 that are in each case connected up between circuit nodes N1, N2, N3.

In a first method step 101, the circuit 10 is converted into a representation that can be processed by a simulation tool. One example of such a circuit representation that can be processed further is a so-called netlist comprising information on all the nodes occurring in the circuit and on the components connected to the respective nodes.

On the basis of said netlist, a DC signal simulation, for example a DC voltage simulation, of the circuit is effected in a next method step 102. In this case, the amplitude of the DC signal used for this simulation is dependent on at least one of the following parameters of the temporally variable signal: amplitude, gradient of a rising edge, duration of a pulsed signal component, gradient of a falling edge. The amplitude of the DC signal corresponds for example to the maximum amplitude of the variable signal, that is to say the break-down voltage of the ideal protection structure Z from FIG. 1. If the real protection structure, at the start of the loading, exhibits a transient overvoltage dependent on the pulse rise time, it is also possible, however, to use the maximum value of said overvoltage. This value is then additionally dependent on the rise duration of the loading pulse.

For the simulation of the behavior of the components present in the circuit, use is made of equivalent DC voltage models of the individual components that are stored in a library 103 accessed by the simulation tool in method step 102. In addition, the behavior of the circuit is simulated for the presence of a DC voltage at connecting terminals. Since the equivalent DC voltage models are chosen such that the currents flowing in the individual branches of the circuit correspond to the maximum value of the current through the respective branches of the real circuit in the event of pulsed loading of the circuit, the DC voltage simulation yields a worst-case result for the currents flowing in the real circuit.

In contrast to a transient simulation using component models suitable therefor, carrying out this DC voltage simulation only requires solving N nonlinear equations, where N is proportional to the number of nodes occurring in the circuit, in order to determine, as the result, the currents flowing in the individual circuit branches and/or the voltages present across the circuit branches. The current and/or voltage values determined by this DC voltage simulation are compared with the predetermined relevance criteria for the individual circuit components in order to output, in a next method step 104, the circuit components of the circuit that have been determined as relevant. Depending on the selection of the relevance criteria, this may concern e.g. the circuit components whose maximum loadability is exceeded and which are therefore to be regarded as jeopardized, or the circuit components which are in a predetermined operating state.

In order to determine the relevant circuit components in a simplified manner, the relevance criteria of the individual circuit components may already be taken into account in the models used for the circuit simulation.

Figure 6:
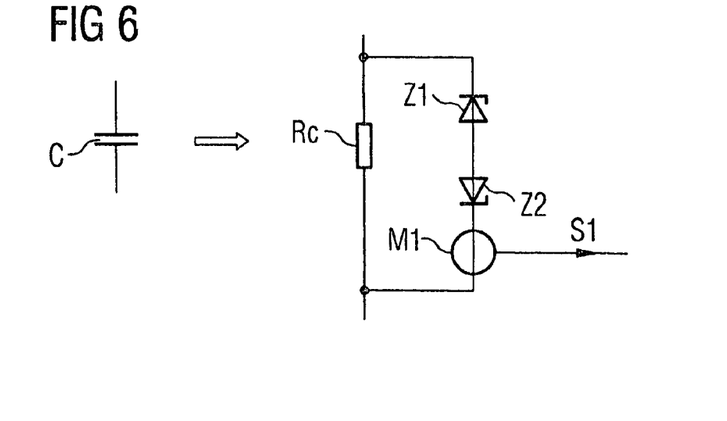
FIG. 6 shows an advantageous equivalent DC voltage model of a capacitor.

Thus, referring to FIG. 6, there is the possibility, by way of example, of implementing the equivalent DC voltage model for a capacitance C such that, in addition to the equivalent resistance Rc and the zener diodes Z1, Z2 that have already been explained with reference to FIG. 4b, a current measuring element M1 is connected in series with the zener diodes Z1, Z2 and provides a current signal S1. Said current measuring element M1 may be dimensioned such that it outputs a predetermined signal value in the case of a correspondingly high current. In order to determine a possible jeopardization of the capacitance C in the actual circuit, it suffices, during the circuit simulation, to interrogate the value of the output signal S1 of the current measuring arrangement M1, the component being assumed to be jeopardized if the output signal S1 of said measuring arrangement M1 has the corresponding signal value.

If the relevant circuit parts, that is to say in particular the relevant connections of the circuit components, are known in a circuit, then all circuit parts which comprise the current distribution through the relevant circuit parts are to be identified for a further-reaching analysis, such as transient simulation, for instance. These are current paths comprising, in addition to the circuit parts determined as relevant, further circuit parts that are referred to hereinafter as involved circuit parts. A more exact transient simulation may subsequently be carried out for these current paths "extracted" from the circuit. For said transient simulation, the equivalent DC voltage models are replaced for example by component models that are suitable for a transient simulation.

Various procedures are possible for the determination of these current-carrying paths with involved circuit components, and these procedures are explained below with reference to FIG. 7.

Figure 7:
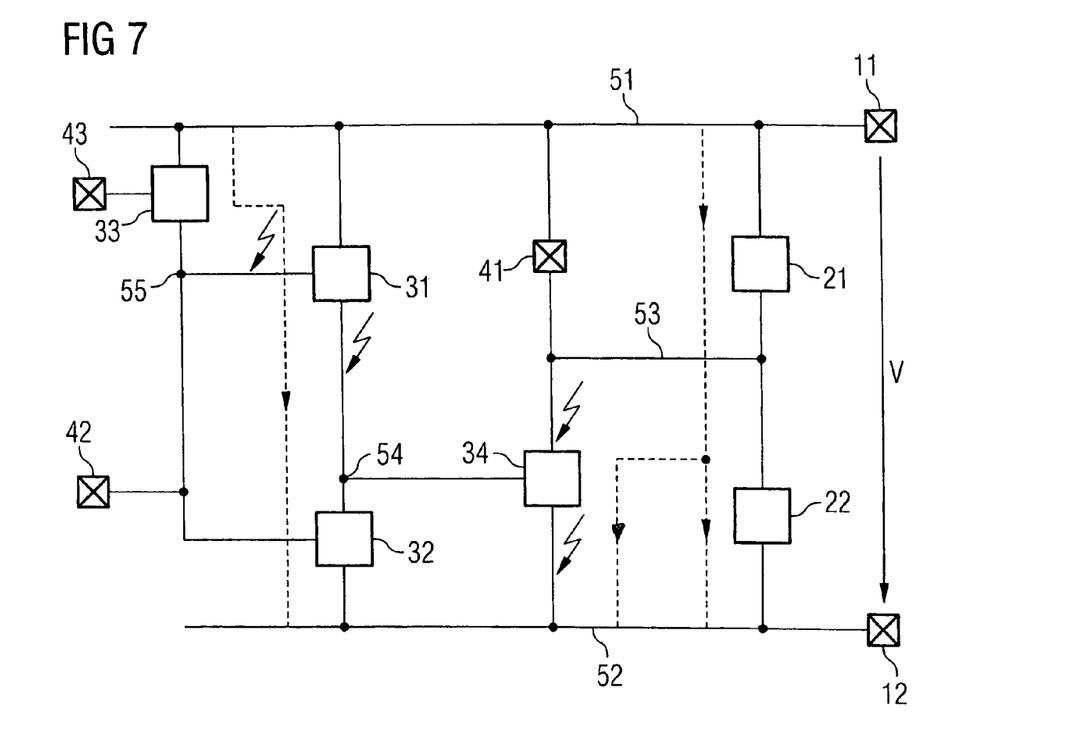
FIG. 7 schematically shows a circuit arrangement with a plurality of components for elucidating the generation of a reduced circuit after determining jeopardized components.

FIG. 7 generally shows a circuit having two-pole circuit components 21, 22 and three-pole circuit components 31, 32, 33, 34 connected up between supply connecting terminals 11, 12 and further connecting terminals 41, 42, 43. The reference symbols 51, 52, 53, 54, 55 designate circuit nodes to which in each case at least two circuit components are connected.

For explanation purposes it is assumed that, in the context of the DC voltage simulation explained, the components 23 and 31 have been determined as relevant, in particular their connections to the nodes 55 and 54, and respectively 53 and 52. Overvoltages, for example, have thus occurred there. This situation will now be examined in greater detail in the context of a transient simulation of a reduced circuit. It should be pointed out that in addition to the method explained, further methods may, of course, be suitable for determining relevant circuit components.

The dashed lines in FIG. 7 illustrate the (critically) current-carrying paths in the circuit that are determined hereinafter.

The method according to the invention for determining involved circuit parts on the basis of relevant circuit parts provides, then, firstly for identifying the relevant circuit parts as involved circuit parts.

Afterward, in each case on the basis of all the circuit parts involved, further circuit parts are examined and identified as involved depending on the result of the examination. This method is continued until, on the basis of all the circuit parts determined as involved, no more further circuit parts can be identified as involved. The criteria for the selection of a circuit component as involved in this case comprise: circuit states of the circuit parts that have already been identified as involved, circuit state of the circuit part being examined, type of connection between the circuit part identified as involved and the circuit part currently being examined, circuit state of said connection. In this case, circuit state is to be understood to mean, in particular, a current through the respective circuit part or a voltage across the respective circuit part.

In one embodiment, it is provided that, on the basis of the components that have already been determined as involved, only those current paths through which flows a current that is greater than a predetermined threshold value are accepted into the reduced circuit. This is explained for the determination of the current paths to the component 34 that has been determined as relevant and is therefore involved: by way of example, if a current lying above said threshold flows through the component 21, while a current lying below said threshold flows through the component 22, then in addition to the component 34 that has already been determined as involved, by way of example, only the component 21 would be accepted into the reduced circuit for the further simulation.

In a further embodiment, it is provided that, from a plurality of circuit components which are connected to a circuit node with a circuit component that has already been identified as involved, only those circuit branches which supply a relevant proportion of the current flowing through the involved circuit component are accepted into the reduced circuit. There is thus the possibility, from the plurality of circuit components connected to the node, of identifying as involved only the one circuit component which supplies the greatest proportion of the current through the component that has already been identified as involved beforehand. As an alternative, there is the possibility, from the plurality of circuit parts, of identifying as involved those which individually or jointly supply or take up a current that lies above a predetermined proportion of the current through the circuit part that has been determined as involved beforehand. It is possible here, of course, to distinguish between currents flowing into the circuit part involved and out of the latter, in order thus to extract e.g. both the circuit part which supplies the greatest current and that which takes up the greatest current.

This is explained using the example of the node 53 in FIG. 7: if e.g. the main proportion of the current through node 53 flows from component 21 to component 22, then component 21 would also be identified as involved (in addition to the component 34 that has already been identified as involved). This is important in order to correctly reproduce the voltage at node 53 in the subsequent transient simulation.

Furthermore, there is the possibility of identifying differently the circuit parts determined as involved depending on the criterion on account of which they were determined. In the example of FIG. 7, e.g. the direct current-carrying paths through the relevant components could be identified separately. For the component 34, this would be the path 11-51-21-53-34-52-12.

The following rules could be used as a criterion on account of which they were identified: for each component and each node, what is newly identified as involved is in each case only the connection through which flows the current which has the greatest magnitude and which has the opposite sign to the current of the connection that has already been identified as involved. In the case of node 53, for instance, on the basis of the relevant, that is to say involved connection to component 34, in which the current flows away from the node, only the connection to component 21, from which current flows into the node, would be identified. By way of example, the connection from 53 to component 22 would not be identified in this way because now the current likewise flows out of the node, that is to say does not have the opposite sign to the current into the component 34. Therefore, component 22 is not contained in the direct current path here although it would possibly identified as involved as described above on account of a different criterion.

In a further embodiment, the number of circuit parts situated at least on the paths to the circuit parts determined as relevant serves as a measure of the distance to the relevant circuit parts. This will be illustrated in FIG. 7: referring to component 31, in one possible mode of counting, its connections would then have the distance 1, the adjacent nodes (nos 51, 54, 55) would have the distance 2, the connections connected otherwise to these nodes would have the distance 3, the following components would have the distance 4, etc.

On the basis of such an identification according to the distance to the nearest relevant circuit part or according to a selection criterion, the selection strategies or thresholds for further involved circuit components can then be made dependent on said identification.

With the above distance definition and corresponding marking, it would be possible, for instance, to stipulate that in the case of components which have at most the distance 4 with respect to relevant circuit parts, in principle all of the connections are identified as involved, and restrictive criteria are applied only in the case of larger distances. It would be ensured in this way that no critical current paths are overlooked in direct proximity to the relevant components but highly selective criteria can nevertheless be used at larger distances.

It would furthermore be possible, in the case of the constituent parts of the direct current paths identified separately in the previous example, to use other criteria for the determination of further involved circuit parts than in the remaining region of the circuit, once again with the aim of excluding, in proximity to said direct current paths, as far as possible no circuit parts which influence the current distribution through the relevant (that is to say e.g. jeopardized) circuit parts in the transient simulation.

In this way, the various criteria can be combined diversely, but it is possible at the same time to avoid a situation in which an excessively large part of the circuit is to be examined or is extracted as involved.

In the present description, the signals in the circuit are based on electrical signals, yet the method can also be applied to circuits whose signals represent other physical quantities. Thus, by way of example, not only voltage and current but also for example hydrostatic pressure and mass flow rate or temperature and heat flow satisfy conservation laws which can be formulated as Kirchhoff's node and mesh laws. Therefore, it is also possible to represent such fluidic or thermal systems by a so-called Kirchhoff network, that is to say a circuit in the above sense.

To summarize, the method according to the invention comprises simulating a pulse loading of an electronic circuit by means of a DC voltage simulation using equivalent DC voltage models for the components occurring in the circuit. Components determined as relevant during the simulation can be extracted by means of the second method described together with further circuit parts that are critical for the current flow, and be subjected to a detailed transient simulation in a reduced circuit.

Both methods can be effected in an automated manner using conventional simulation tools, it being necessary merely to make available a library with equivalent DC voltage models of the circuit components occurring in the circuit. Referring to the preceding embodiments, said equivalent DC voltage models are chosen such that the current flowing through these modeled components when a DC voltage is applied to the circuit corresponds to the maximum current flowing through the real components in the event of a pulsed voltage. The result of the DC voltage simulation then produces voltages and currents for the worst case, which correspond to the voltage and current spikes during the actual transient processes in the real circuit, but with considerably less computation time.

The equivalent DC signal models of complex components can be derived on the basis of already existing models of these components using the equivalent models for capacitance, inductances and resistances. It goes without saying that it is also possible in this case to create equivalent models for entire circuit blocks which suitably describe the input and output behavior of said circuit blocks.

LIST OF REFERENCE SYMBOLS

10 Circuit
11, 12 Supply connections
11, 12 Supply connections
21, 22 Two-pole components
31-34 Three-pole components
41 Signal input/output
41-44 Connecting terminals
51-54 Circuit nodes
C Capacitor
Cd Parasitic capacitance of a diode
D Diode
Di Ideal diode
Ic Capacitor current
$\hat{I}c$ Maximum value of the capacitor current
Iesd ESD pulse
$\hat{I}l$ Maximum value of the current through the inductance Ip Current through the inductance
Îr Maximum value of the current through the resistance
Ir Current through the resistance
L Inductance
M1 Current measuring arrangement
R Resistance
Rc Equivalent resistance
Rd Equivalent resistance
tp Pulse duration
tr Rise time
Uin Input voltage
Ûin Maximum value of the input voltage
V Supply voltage
Z Zener diode
Z1, Z2 Zener diodes

The invention claimed is:

1. A method for determining relevant circuit parts in a circuit in the event of loading with a temporally variable signal, the circuit having a plurality of circuit components operably interconnected and each operably connected between at least two circuit nodes, at least one relevance criterion in each case being assigned to at least some of the circuit parts, the method comprising:
providing a computer-implemented model of the circuit, the model including circuit components represented at least partly by equivalent DC signal models, the parameters of the equivalent DC signal models taking account of at least one of a plurality of parameters of the temporally variable signal, the plurality of parameters consisting of: a gradient of a rising edge, a duration of a pulsed signal component, and a gradient of a falling edge,
carrying out a DC signal analysis using the model, including involving a DC signal present on at least two connections of the circuit, the DC signal being dependent on at least one of a second plurality of parameters of the temporally variable signal, the second plurality of parameters consisting of an amplitude, the gradient of the rising edge, the duration of the pulsed signal component, and the gradient of the falling edge, and wherein the DC signal analysis includes identifying as relevant circuit parts any circuit part that satisfies at least one corresponding relevance criterion on account of the DC signal present at the circuit.

2. The method as claimed in claim 1, wherein the circuit parts comprise circuit components, connections and circuit nodes.

3. The method as claimed in claim 1, wherein the temporally variable signal comprises a current signal and the DC signal is a DC current signal.

4. The method as claimed in claim 1, wherein the at least one relevance criterion is satisfied if a current flowing through the circuit part or a voltage present across the circuit part reaches a predetermined threshold.

5. The method as claimed in claim 1, wherein at least two relevance criteria are defined at least some circuit parts, each of the at least two relevance criteria assigned to different relevance categories, and wherein the circuit parts which satisfy the corresponding relevance criterion are determined for each of the different relevance categories.

6. The method as claimed in claim 1, wherein at least one relevance criterion is chosen such that the event of the relevance criterion being satisfied corresponds to a risk of damage to the assigned circuit part.

7. The method as claimed in claim 1, wherein at least one relevance criterion is chosen such that the event of the relevance criterion being satisfied corresponds to operation of a circuit part in a specific operating state.

8. The method as claimed in claim 1, wherein:
the equivalent DC signal model of a circuit component includes a modeling component based on the at least one relevance criterion assigned to the circuit component.

9. The method as claimed in claim 8 wherein the modeling component includes at least one zener diode operated in the break-down direction in the event of the relevance criterion being satisfied.

10. The method as claimed in claim 1, wherein an equivalent DC voltage model of a capacitance having a given capacitance value comprises a resistance value, the resistance value based on a quotient of a rise time of the rising edge of the temporally variable signal and the given capacitance value.

11. The method as claimed in claim 1, wherein an equivalent DC voltage model of a capacitance having a voltage-dependent capacitance value comprises a resistance value, the resistance value based on a quotient of a rise time of the rising edge of the DC signal and a function of the voltage-dependent capacitance value.

12. The method as claimed in claim 11, wherein the function of the voltage-dependent capacitance value is one of a group consisting of a maximum of the capacitance value, a minimum of the capacitance value and a mean value of the capacitance value.

13. The method as claimed in claim 1, wherein an equivalent DC voltage model of an inductance having a given inductance value comprises a resistance value, the resistance value based on a quotient of the given inductance value and the duration of the pulsed signal component of the temporally variable signal.

14. The method as claimed in claim 1, wherein an equivalent DC voltage model of a voltage-dependent inductance having a given inductance value comprises a resistance value, the resistance value based on a quotient of a function of the voltage-dependent inductance value and the duration of the pulsed signal component of the temporally variable signal.

15. The method as claimed in claim 14, wherein the function of the voltage-dependent inductance value is one of a group consisting of a minimum of the inductance value, a maximum of the inductance value and a mean value of the inductance value.

16. A computing device executing a computer program to carrying out a method as claimed in claim 1.

* * * * *